(12) United States Patent
Hirabayashi

(10) Patent No.: US 7,277,322 B2
(45) Date of Patent: Oct. 2, 2007

(54) SEMICONDUCTOR MEMORY DEVICE HAVING ECC CIRCUIT

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 498 days.

(21) Appl. No.: 10/930,767

(22) Filed: Sep. 1, 2004

(65) Prior Publication Data

US 2005/0278594 A1   Dec. 15, 2005

(30) Foreign Application Priority Data

Jun. 15, 2004   (JP)   ............................. 2004-177164

(51) Int. Cl.
*G11C 11/34* (2006.01)
(52) U.S. Cl. ............. 365/185.09; 365/210; 365/189.08
(58) Field of Classification Search ........... 365/185.09, 365/210, 189.08, 201, 203, 189.05, 189.01
See application file for complete search history.

(56) References Cited

U.S. PATENT DOCUMENTS

| | | | | |
|---|---|---|---|---|
| 5,325,337 A | * | 6/1994 | Buttar ........................ | 365/210 |
| 6,252,814 B1 | * | 6/2001 | Tran et al. .................. | 365/210 |
| 6,490,214 B2 | * | 12/2002 | Kawasumi ................... | 365/210 |
| 6,928,026 B2 | * | 8/2005 | Anvar et al. ................ | 365/233 |
| 7,006,396 B2 | * | 2/2006 | Kodama ..................... | 365/203 |
| 2005/0005230 A1 | * | 1/2005 | Koga et al. ................. | 714/800 |

OTHER PUBLICATIONS

Kazutami Arimoto, et. al., "A Speed-Enhanced DRAM Array Architecture With Embedded ECC", IEEE Journal of Solid-State Circuits, vol. 25, No. 1, pp. 11-17, Feb. 1990.
Bharadwaj S. Amrutur, et. al., "A Replica Technique for Wordline and Sense Control in Low-Power SRAM's", IEEE Journal of Solid-State Circuits, vol. 33, No. 8, pp. 1208-1219, Aug. 1998.
U.S. Appl. No. 11/434,064, filed May 16, 2006, Hirabayashi.

* cited by examiner

*Primary Examiner*—Richard T. Elms
*Assistant Examiner*—Dang Nguyen
(74) *Attorney, Agent, or Firm*—Oblon, Spivak, McClelland, Maier & Neustadt, P.C.

(57) ABSTRACT

A semiconductor device includes a memory cell array and first and second replica bit lines. A plurality of memory cells are arranged in an array form on the memory cell array. The first replica bit line is configured by wirings having the same wiring width and wiring intervals as bit lines configuring the memory cell array and is operated to generate a read timing signal. The second replica bit line is configured by wirings having the same wiring width and wiring intervals as the bit lines configuring the memory cell array and is operated to generate a write timing signal.

18 Claims, 6 Drawing Sheets

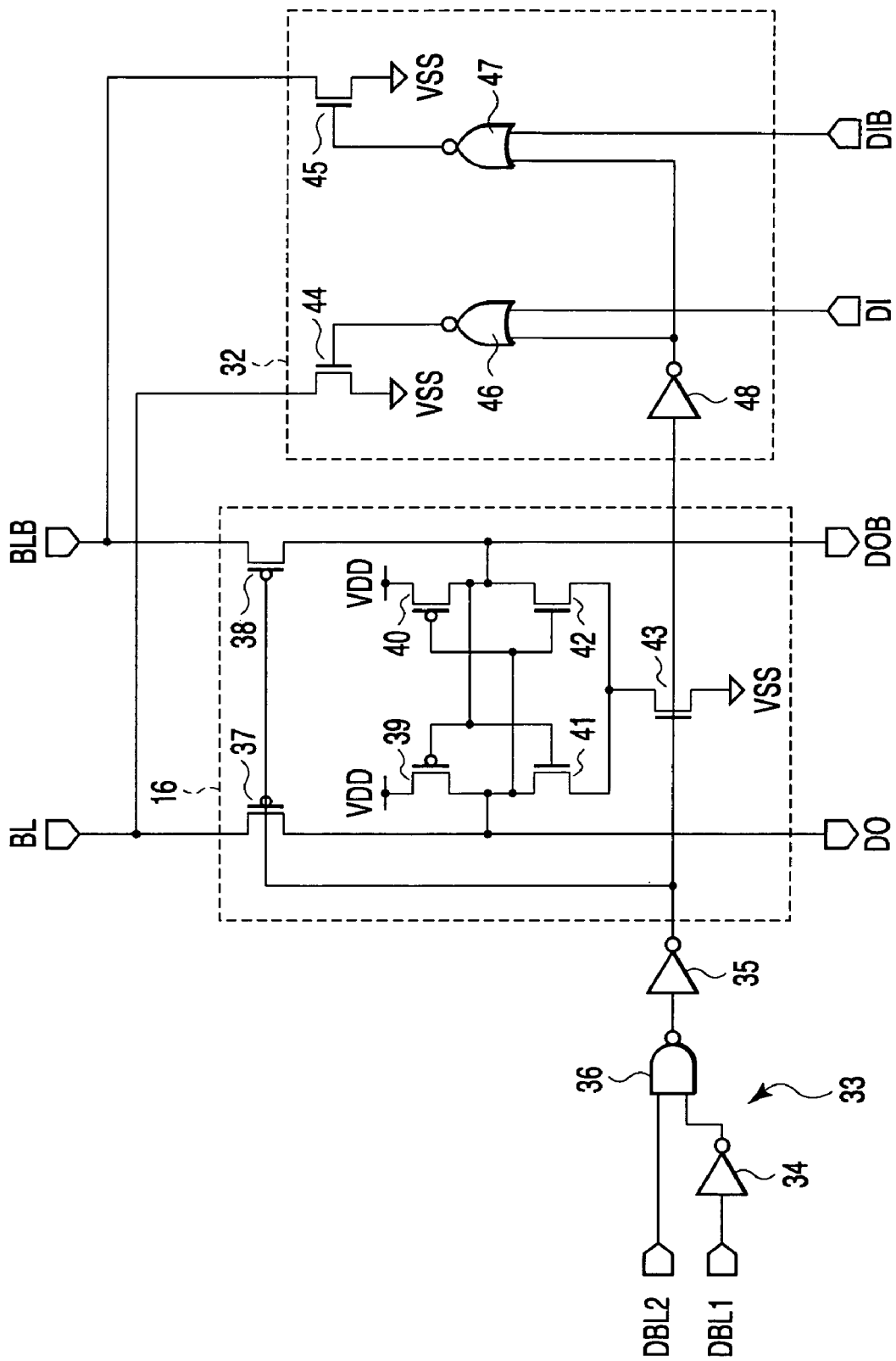
F I G. 5

SEMICONDUCTOR MEMORY DEVICE HAVING ECC CIRCUIT

CROSS-REFERENCE TO RELATED APPLICATIONS

This application is based upon and claims the benefit of priority from prior Japanese Patent Application No. 2004-177164, filed Jun. 15, 2004, the entire contents of which are incorporated herein by reference.

BACKGROUND OF THE INVENTION

1. Field of the Invention

This invention relates to a semiconductor memory device, a semiconductor device having a semiconductor memory device and logic circuit formed in one chip or a semiconductor device such as a system on chip (SoC) and more particularly to a semiconductor device having an ECC circuit to correct an error in data read out from a semiconductor memory device.

2. Description of the Related Art

Miniaturization of elements with the development of the semiconductor device technology causes a reduction in the memory node capacitance of each memory cell in a semiconductor memory device and a soft error tends to become a serious problem.

Therefore, as the countermeasure against the soft error, an error correcting code (ECC) circuit is provided in the chip (for example, refer to K. Arimoto et al., "A Speed-Enhanced DRAM Array Architecture with Embedded ECC," IEEE JOURNAL OF SOLID-STATE CIRCUITS, VOL. 25, NO. 1, FEBRUARY 1990, pp. 11-17). In a semiconductor memory device having the ECC circuit, code bits for checking are stored in addition to normal data bits and the presence or absence of an error in the data bits is detected based on the value of the code bits. Further, the bit position in which the error has occurred is detected by use of the ECC circuit, the error is corrected and error-corrected data is output. In the ECC circuit, the number of error bits of memory cells selected by the same word which can be corrected is determined according to a code used. Generally, a single error correction-double error detection (SEC-DED) code which can be used to make one-bit error correction or 2-bit error detection in addition to one-bit error correction is widely used.

In the conventional semiconductor memory device having the ECC circuit, the number of code bits required for correcting a one-bit error is different depending on the number of data bits. For example, a 7-bit code is required for correcting a one-bit error in 32-bit data. Therefore, memory cells for the code bits of seven bits in addition to data bits of 32 bits are required and the total memory capacity which is approximately 1.22 times the original memory capacity is required.

In order to suppress an increase in the memory capacity due to use of the code bits, a method for applying the ECC circuit to cope with a larger number of data bits in the semiconductor memory device is proposed. For example, an ECC circuit is used to cope with 128-bit data in the internal portion and desired 32-bit data is selected from corrected 128-bit data by use of a multiplexer and output. In this case, since a code of nine bits can be used to cope with 128-bit data, the total memory capacity can be suppressed to approximately 1.07 times the original memory capacity.

However, with the above configuration, there occurs a problem that the operation becomes complicated and the operation speed is lowered. This is specifically explained below. In the data read operation, first, "128 bits (data)+9 bits (code)" are read out and then an error in the data (128 bits) is corrected by use of the ECC circuit. After this, data of required 32 bits among the 128-bit data is multiplexed and output.

In the write operation, it is necessary to first read out all of the 128-bit data before 32-bit data is written. This is because the code bit cannot be calculated if all of the 128-bit data is not arranged and it is necessary to read out 96-bit data other than the 32-bit data which is to be written.

Therefore, when a write command is issued, it is required for the semiconductor memory device to perform two operations of the read operation and write operation. As a result, there occurs a problem that the operation speed is lowered to approximately half in comparison with a case of the normal write operation.

BRIEF SUMMARY OF THE INVENTION

According to an aspect of the present invention, there is provided a semiconductor device comprising a memory cell array having a plurality of memory cells arranged in an array form, a first replica bit line configured by wirings having substantially the same wiring width and wiring intervals as bit lines in the memory cell array and formed to generate a read timing signal, and a second replica bit line configured by wirings having substantially the same wiring width and wiring intervals as the bit lines in the memory cell array and formed to generate a write timing signal.

BRIEF DESCRIPTION OF THE SEVERAL VIEWS OF THE DRAWING

FIG. 5 is a circuit diagram showing a sense amplifier and write buffer circuit of the semiconductor device according to the first embodiment of this invention;

DETAILED DESCRIPTION OF THE INVENTION

Figure 1:
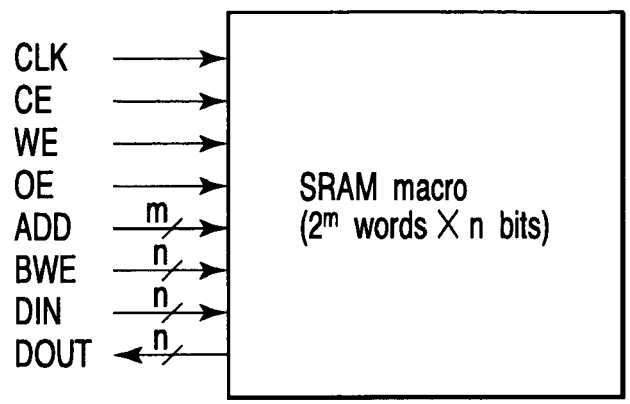
FIG. 1 is a block diagram showing the schematic configuration of a semiconductor device according to a first embodiment of this invention.

FIG. 1 is a block diagram showing the schematic configuration of a semiconductor device according to a first embodiment of this invention. In this case, an SRAM macro with $2^m$ words×n bits is used as an example. A clock signal CLK, chip enable signal CE, write enable signal WE, output enable signal OE, m-bit address signal ADD, n-bit bit write enable signal BWE and n-bit data input signal DIN are input to the SRAM macro and n-bit data (output signal) DOUT is output therefrom.

The word number m and the bit number n are both variable and a configuration of adequate words×bits can be realized as required.

Figure 2:
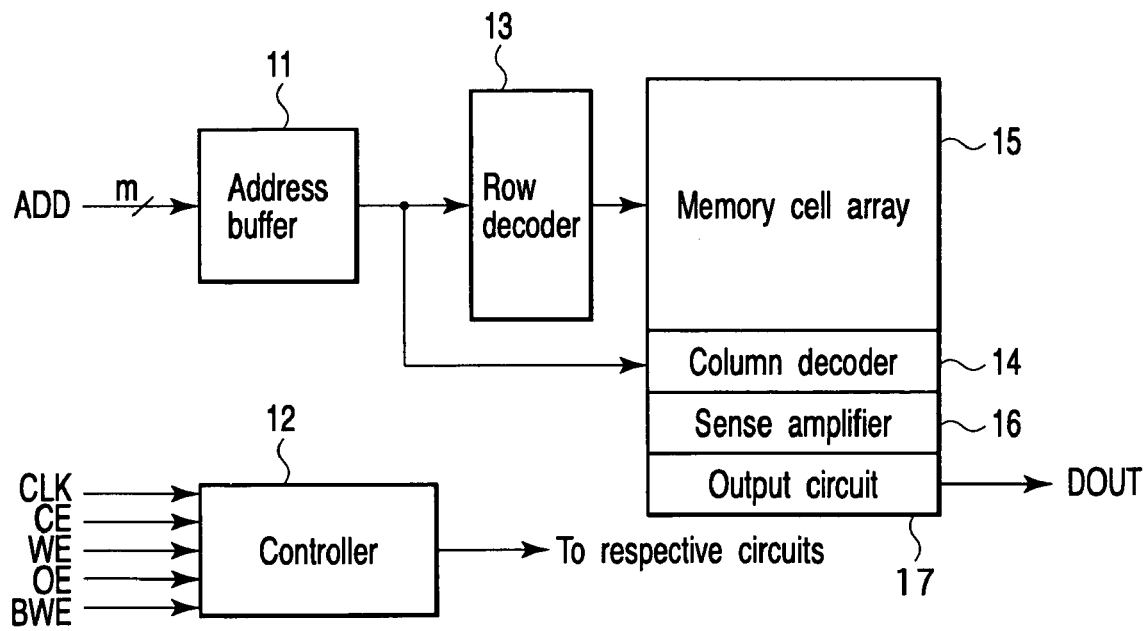
FIG. 2 is a block diagram showing an example of the concrete internal configuration of an SRAM macro shown in FIG. 1.

FIG. 2 shows an example of the concrete internal configuration of the SRAM macro shown in FIG. 1. The m-bit address signal ADD is supplied to an address buffer 11 and the clock signal CLK, chip enable signal CE, write enable signal WE, output enable signal OE and n-bit bit write enable signal BWE are supplied to a controller 12. A row address signal output from the address buffer 11 and a column address signal are respectively supplied to and decoded by a row decoder 13 and column decoder 14. A word line in a memory cell array 15 is selected by use of the row decoder 13 and a bit line pair is selected by use of the column decoder 14.

The controller 12 controls the respective circuits and the operation mode and operation timing of the read operation and write operation of the semiconductor memory device are controlled by the controller 12.

Data read out from the memory cell selected in the memory cell array 15 is amplified by a sense amplifier 16 and read data (output signal) DOUT is output from an output circuit 17.

Figure 3:
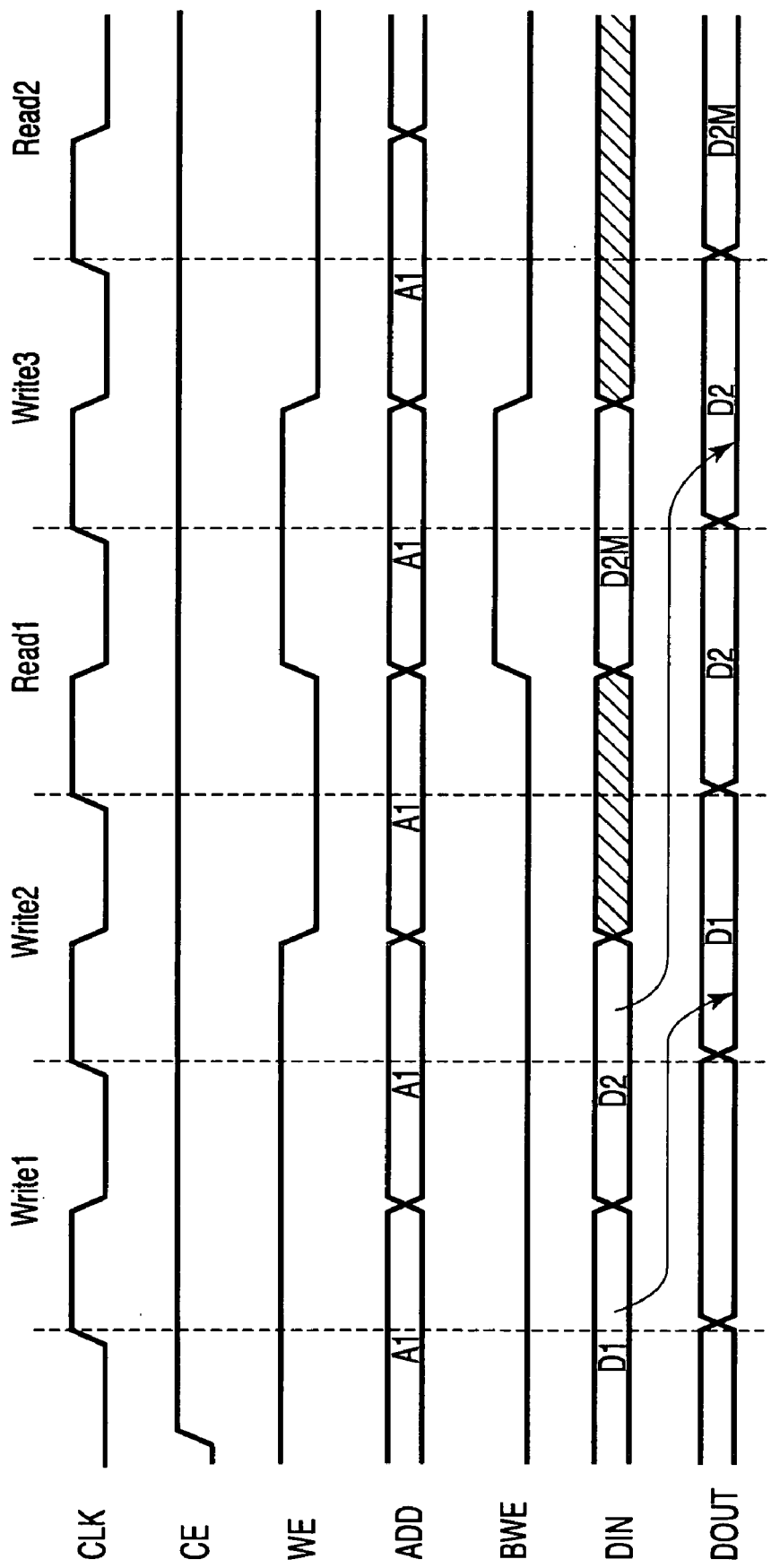
FIG. 3 is an operational waveform diagram for illustrating the operation of the SRAM macro shown in FIGS. 1 and 2.

Next, with the above configuration, the operation of the SRAM macro shown in FIGS. 1 and 2 is explained by use of an operational waveform diagram of FIG. 3. The operational waveform diagram of FIG. 3 shows a case wherein accesses are successively made with respect to an address A1 of the memory cell array 15. In the first cycle (Write1), a write command of data D1 is input with respect to the address A1. At this time, the data D1 is written into a memory cell corresponding to the address A1 in the semiconductor memory device. In the next cycle (Write2), a write command of data D2 is input with respect to the address A1. At this time, data (D1) is first read out from the memory cell corresponding to the address A1 and an output signal OUT is output in the semiconductor memory device. After this, the data D2 is written into the memory cell corresponding to the address A1. In the next cycle (Read1), a read command with respect to the address A1 is input. At this time, data. (D2) is first read out from the memory cell corresponding to the address A1 and an output signal OUT is output in the semiconductor memory device. In the next cycle (Write3), a write command indicating the presence of a write mask is input with respect to the address A1 and write data D2M which is only part of n-bit data is input. At this time, data (D2) is first read out from the memory cell corresponding to the address A1 and an output signal OUT is output in the semiconductor memory device. After this, the data D2M is written into only a bit specified by the write mask in the memory cell corresponding to the address A1. Further, in the next cycle (Read2), a read command with respect to the address A1 is input. At this time, data (D2M) is read out from the memory cell corresponding to the address A1 and an output signal OUT is output in the semiconductor memory device.

Figure 4:
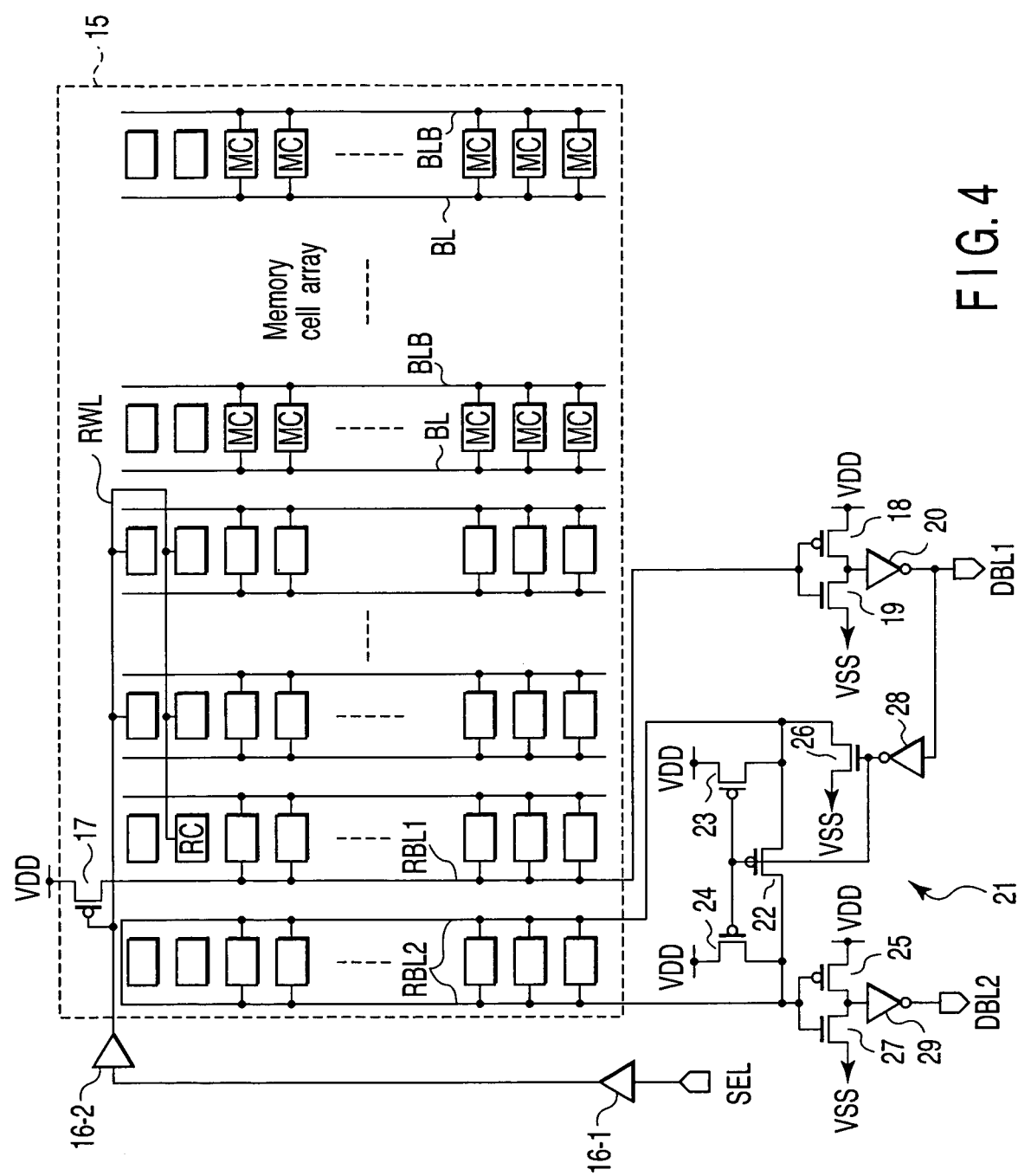
FIG. 4 is a circuit diagram showing an example of the configuration of an extracted part of an internal timing generator in the semiconductor device according to the first embodiment of this invention.

FIG. 4 shows an example of the configuration of an extracted part of an internal timing generator in the semiconductor device according to the first embodiment of this invention. Generally, in the memory macro in which the configuration of words×bits is variable, timing signals are generated by use of the replica technique so as to perform the read operation at optimum timing irrespective of the circuit configuration (for example, refer to B. S. Amrutur et al., "A Replica Technique for Wordline and Sense Control in Low-Power SRAM's," IEEE JOURNAL of SOLID-STATE CIRCUITS, VOL. 33, NO. 8, AUGUST 1998, pp. 1208-1219).

That is, as shown in FIG. 4, the semiconductor device of this embodiment includes a replica word line RWL and first, second replica bit lines RBL1, RBL2 in the memory cell array 15. A plurality of memory cells MC are arranged in an array form in the memory cell array 15. The memory cells MC of each row are connected to a corresponding one of word lines (not shown) and the memory cells of each column are connected to corresponding ones of bit lines BL, BLB.

The replica word line RWL and first, second replica bit lines RBL1, RBL2 are arranged in the end portions of the memory cell array 15. The replica word line RWL is turned back at the center of the memory cell array 15 and one end thereof is supplied with a selection signal SEL via buffers 16-1, 16-2. The current path of a P-channel MOSFET 17 is connected between one end of the first replica bit line RBL1 and the power supply VDD and the gate of the MOSFET 17 is connected to the output terminal of the buffer 16-2. Further, the other end of the first replica bit line RBL1 is connected to an input terminal of a CMOS inverter configured by a P-channel MOSFET 18 and N-channel MOSFET 19. The output terminal of the CMOS inverter is connected to the input terminal of an inverter 20 and a timing signal DBL1 is output from the output terminal of the inverter 20. The configuration is made to supply the timing signal DBL1 to a replica write buffer circuit 21 connected to the second replica bit line RBL2.

The replica write buffer circuit 21 includes P-channel MOSFETs 22 to 25, N-channel MOSFETs 26, 27 and inverters 28, 29. The current path of the MOSFET 26 is connected between one end of the second replica bit line RBL2 and the ground VSS and the gate of the MOSFET 26 is connected to the output terminal of the inverter 28. The input terminal of the inverter 28 is connected to the output terminal of the inverter 20 and supplied with a timing signal DBL1. The second replica bit line RBL2 is turned back at the end portion of the memory cell array 15 and the current path of the MOSFET 22 is connected between the two folded portions of the second replica bit line RBL2. Further, the current paths of the MOSFETs 23, 24 are respectively connected between the power supply VDD and one end and the other end of the second replica bit line RBL2. The gates of the MOSFETs 22 to 24 are supplied with the timing signal DBL1 via the inverter 28. The other end of the second replica bit line RBL2 is connected to the input terminal of a CMOS inverter configured by the P-channel MOSFET 25 and N-channel MOSFET 27. The output terminal of the above CMOS inverter is connected to the input terminal of the inverter 29 and a timing signal DBL2 is output from the output terminal of the inverter 29.

The replica word line RWL is activated at the same time as the normal word lines and causes the same delay amount as the word line for a signal which passes through a wiring having the same wiring length, wiring width and load capacitance as the normal word line (the replica word line is folded back at the center of the memory cell array 15 in FIG. 4). The remotest end of the replica word line RWL is connected to a replica cell RC. The first replica bit line RBL1 is precharged to a high level (VDD level) via the MOSFET 17 and the replica cell RC causes the potential of the first replica bit line RBL1 to be lowered to a low level when the replica word line RWL is activated. The first replica bit line RBL1 is designed to have the same wiring length, wiring width and load capacitance as one of the normal paired bit lines BL, BLB and produces a timing with the same delay amount as the bit line delay amount.

Thus, a timing signal DBL1 with the same delay as "word line delay+bit line delay" is attained. By controlling activation of the sense amplifier according to the thus attained timing signal DBL1, the circuit configuration can be operated at optimum timing even when the word line length and bit line length are changed. Further, the circuit configuration can be operated at optimum timing even when the word line delay and bit line delay are changed due to variations in the power supply voltage and temperature, process fluctuation or the like.

Further, in the semiconductor device of the present embodiment, the timing signal DBL1 generated from the first replica bit line RBL1 is input to the replica write buffer circuit 21. The replica write buffer circuit 21 has the same write characteristic (current driving ability) as the normal write buffer circuit and drives the second replica bit line RBL2. The second replica bit line RBL2 has two wirings each having the same wiring length, wiring width and load capacitance as one of the normal paired bit lines BL, BLB and is configured by connecting the two wirings at the remotest ends thereof.

Further, potential of the second replica bit line RBL2 is input to the inverter 29 whose circuit threshold voltage is approximately half (VDD/2) the power supply voltage VDD. The second replica bit line RBL2 is precharged to the high level (VDD level) by the MOSFETs 22 to 24 when the timing signal DBL1 is set at the high level. The potential of the second replica bit line RBL2 is lowered to the low level (VSS level) by the MOSFET 26 at the timing at which the timing signal DBL1 transits to the low level. At this time, when the potential of the second replica bit line RBL2 is lowered to approximately half (VDD/2) the power supply voltage VDD, an output of the inverter 29 is inverted and output as the timing signal DBL2. Since the second replica bit line RBL2 has capacitance which is twice that of the normal bit line BL or BLB, the transition time of the thus generated timing signal DBL2 becomes equal to time required for potential of the normal bit line BL or BLB to be fully swung by a normal write buffer circuit 32.

FIG. 5 is a circuit diagram showing a sense amplifier and write buffer circuit (normal write buffer circuit) of the semiconductor device according to the first embodiment of this invention. A sense amplifier 16 is connected between the bit line pair BL, BLB and data line pair D0, D0B and the write buffer circuit 32 is connected between the bit line pair BL, BLB and data line pair D1, D1B. The operations of the sense amplifier 16 and write buffer circuit 32 are controlled by an output signal of a logic circuit 33 to which the timing signals DBL1, DBL2 generated by use of the first, second replica bit lines RBL1, RBL2 are input.

The logic circuit 33 includes inverters 34, 35 and NAND gate 36. The timing signal DBL1 is supplied to the input terminal of the inverter 34 and an output signal of the inverter 34 and the timing signal DBL2 are supplied to the NAND gate 36. An output signal of the NAND gate 36 is supplied to the inverter 35.

The sense amplifier 16 includes P-channel MOSFETs 37 to 40 and N-channel MOSFETs 41 to 43. The current paths of the MOSFETs 37, 38 are connected between the paired bit lines BL, BLB and the paired data lines D0, D0B and the gates thereof are connected to the output terminal of the inverter 35. One-side ends of the current paths of the MOSFETs 39, 40 are connected to the power supply VDD and the other ends thereof are respectively connected to the paired data lines D0, D0B. One-side ends of the current paths of the MOSFETs 41, 42 are connected to the other ends of the current paths of the MOSFETs 39, 40 and the other ends thereof are commonly connected to one end of the current path of the MOSFET 43. The gates of the MOSFETs 39, 41 are commonly connected to a connection node of the current paths of the MOSFETs 40, 42 and the gates of the MOSFETs 40, 42 are commonly connected to a connection node of the current paths of the MOSFETs 39, 41. The other end of the current path of the MOSFET 43 is connected to the ground VSS and the gate thereof is connected to the output terminal of the inverter 35.

The write buffer circuit 32 includes MOSFETs 44, 45, NOR gates 46, 47 and inverter 48. One-side ends of the current paths of the MOSFETs 44, 45 are respectively connected to the paired bit lines BL, BLB and the other ends thereof are connected to the ground VSS. The gates of the MOSFETs 44, 45 are connected to the output terminals of the NOR gates 46, 47. One-side input terminals of the NOR gates 46, 47 are commonly connected to the output terminal of the inverter 48 and the other input terminals thereof are respectively connected to the paired data lines D1, D1B. The input terminal of the inverter 48 is connected to the output terminal of the inverter 35.

As in the conventional case, with the above configuration, the sense amplifier 16 is activated to perform the read operation when the timing signal DBL1 generated from the first replica bit line RBL1 is set to the low level. In the semiconductor device of this embodiment, the write buffer circuit 32 is operated to start the write operation at the same time that the read operation is performed. After this, when the timing signal DBL2 generated from the second replica bit line RBL2 is set to the low level, the operation of the write buffer circuit 32 is interrupted (the MOSFETs 44, 45 are turned off) to terminate the write operation.

Figure 6:
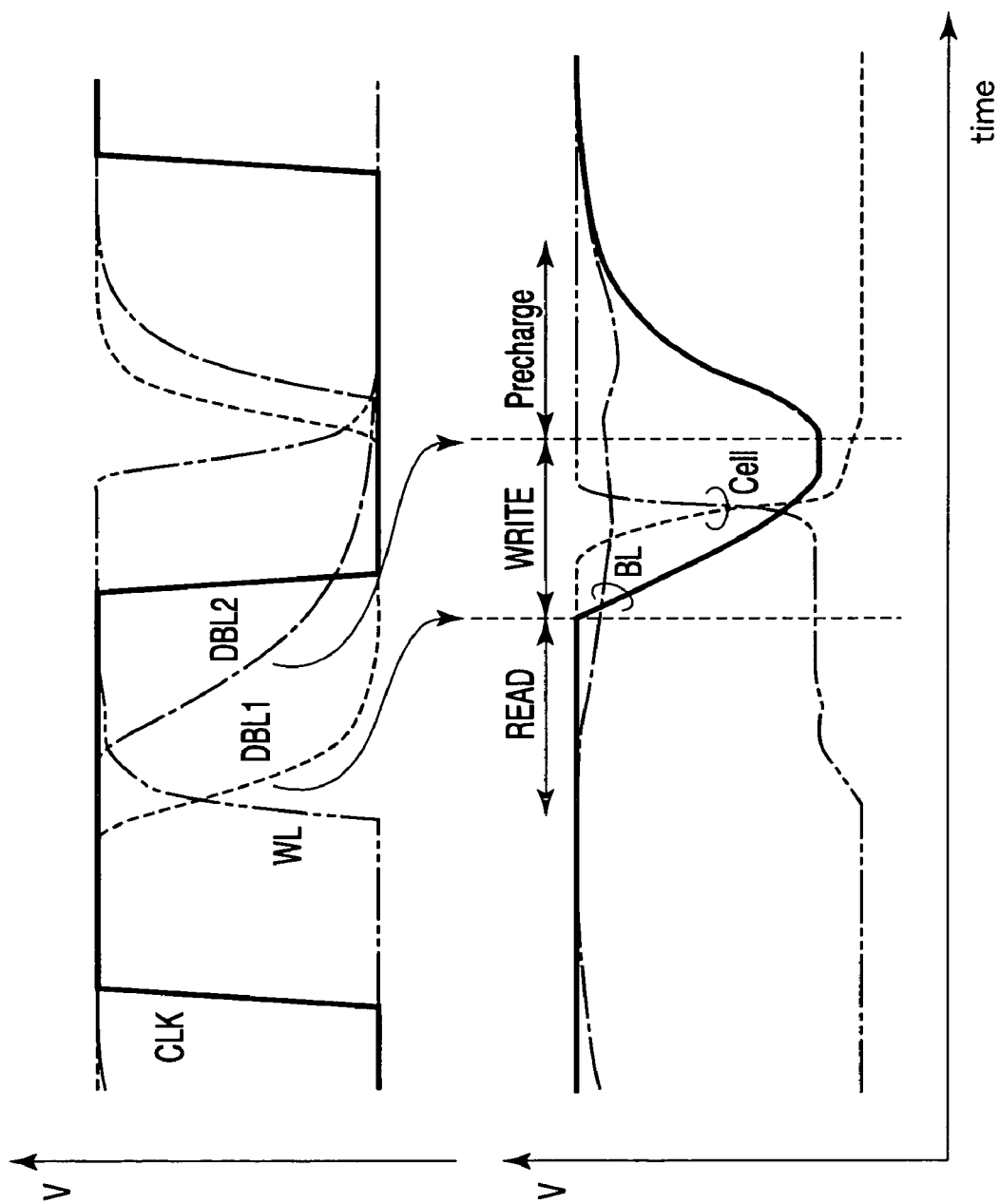
FIG. 6 is an operational waveform diagram for illustrating the internal operation when a write command is issued in the semiconductor device according to the first embodiment of this invention.

FIG. 6 is an operational waveform diagram for illustrating the internal operation at the write command time in the semiconductor device according to the first embodiment of this invention. The word line WL is selected in synchronism with the clock signal CLK. Then, the timing signal DBL1 generated from the first replica bit line RBL1 is set to the low level and the timing signal DBL2 generated from the second replica bit line RBL2 is set to the low level. When the word line WL is selected, an infinitesimal potential difference occurs between the paired bit lines BL and BLB. When the timing signal DBL1 is set to the low level, the sense amplifier 16 is activated to read out data. The thus read data is output from the output circuit 17 as an output signal DOUT. Further, the write buffer circuit 32 is operated at the same time that the sense amplifier 16 is activated and the potential of one of the paired bit lines BL, BLB (in this example, BL) is lowered to the low level to write data into the memory cell (Cell). After this, when the timing signal DBL2 is set to the low level, the operation of the write buffer circuit 32 is interrupted to terminate the write operation and the bit line BL is precharged to the high level.

With the above configuration, an SRAM macro in which the high-speed read and write serial operations can be performed by use of the read and write replica bit lines RBL1, RBL2 and which copes with the ECC circuit capable of changing the macro size can be provided.

Second Embodiment

In the semiconductor device according to the first embodiment, the second replica bit line RBL2 is formed by connecting together two wirings each having the same wiring length, wiring width and load capacitance as one of the normal paired bit lines BL, BLB. Further, the delay time which is equal to the delay time caused when the potential of the normal bit line BL or BLB is fully swung can be attained by configuring the replica write buffer circuit 21 to have the same current driving ability as the normal write buffer circuit 32.

However, if an influence by the resistance of the bit line BL or BLB is large, timing at which the timing signal is generated by use of the second replica bit line RBL2 is delayed in some cases with respect to timing at which the potential of the normal bit line BL, BLB is fully swung.

Figure 7:
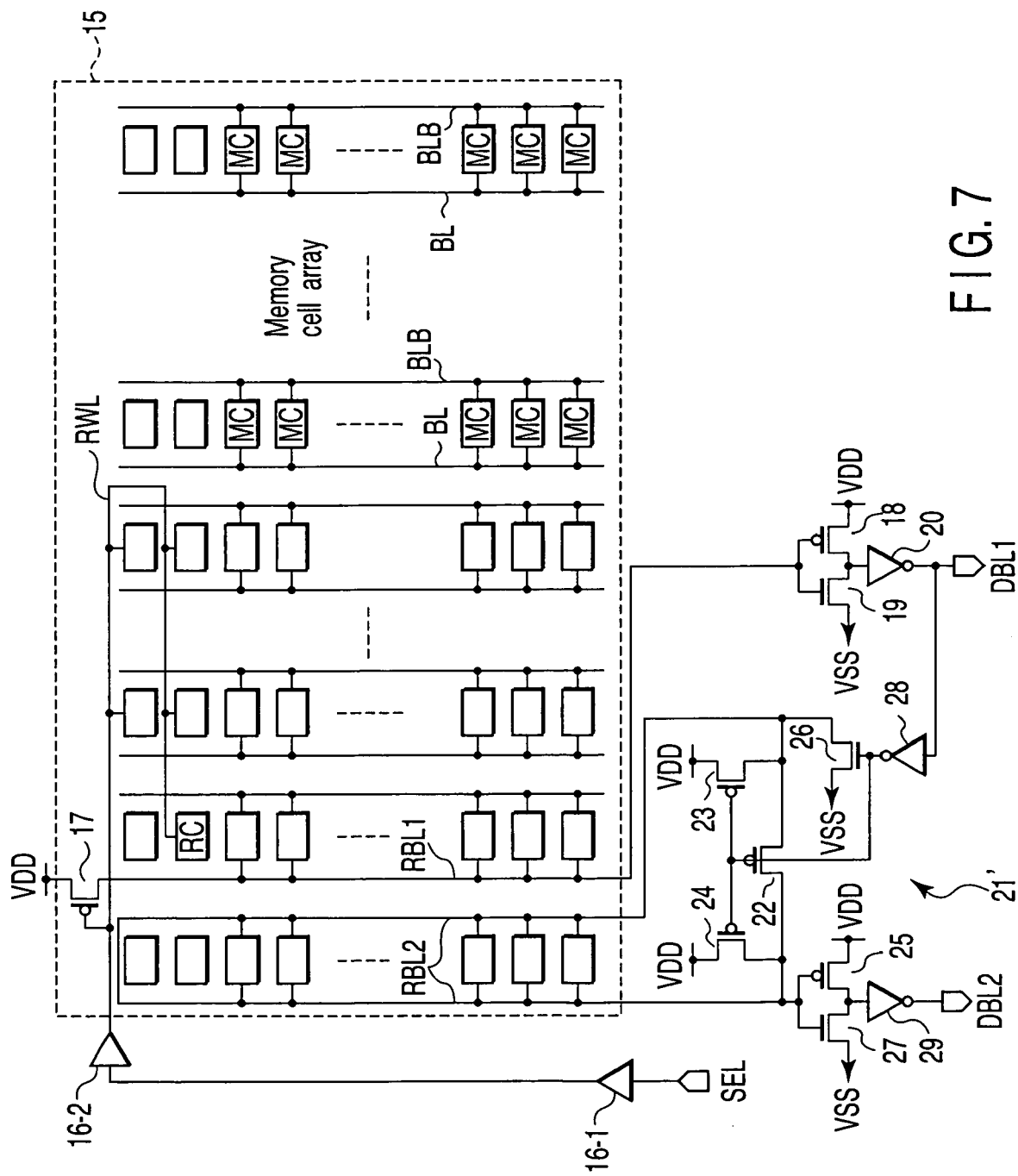
FIG. 7 is a circuit diagram showing an example of the configuration of an extracted part of an internal timing generator, for illustrating a semiconductor device according to a second embodiment of this invention.

In order to cope with the above problem, in the semiconductor device according to the second embodiment, a second replica bit line RBL2 is formed by connecting together two wirings each having the same wiring width as and half the wiring length and half the load capacitance of each of the normal paired bit lines BL, BLB as shown in FIG. 7. Further, the basic circuit configuration of a replica write buffer circuit 21' is the same as that of the circuit 21 shown in FIG. 4, but the current driving ability is different and is set to half the current driving ability of the normal write buffer circuit 32. The other basic configuration is the same as that in the first embodiment.

With the above configuration, an influence by the wiring resistance of the second replica bit line RBL2 is equal to that caused by the normal bit line BL or BLB. Therefore, the delay time can be set equal to the delay time caused when the potential of the normal bit line BL or BLB is fully swung.

As described above, in the semiconductor device according to the first and second embodiments of this invention, the first, second replica bit lines RBL1, RBL2 for setting the read timing and write timing and the replica write buffer circuit 21 are provided to generate the timings signals DBL1, DBL2 and control the read and write serial operation timings. Thus, the high-speed read and write serial operation can be performed and the configuration of words×bits can be varied.

Therefore, even if the ECC circuit is provided, the operation speed can be enhanced while an increase in the memory capacity due to use of code bits is suppressed.

In the first, second embodiments, a case wherein the SRAM macro is used as the semiconductor memory device as an example is explained. However, it is of course possible to apply this invention to another semiconductor memory device. If a semiconductor device is a semiconductor device having an ECC circuit to correct an error contained in data output from a semiconductor memory device, the semiconductor device can be applied to a semiconductor device having a semiconductor memory device and logic circuit formed in one chip or an SoC, for example.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a memory cell array having a plurality of memory cells arranged in an array form;
    a first replica bit line configured by wirings having substantially the same wiring width and wiring intervals as bit lines in the memory cell array and formed to generate a read timing signal;
    a second replica bit line configured by wirings having substantially the same wiring width and wiring intervals as the bit lines in the memory cell array and formed to generate a write timing signal; and
    a write buffer circuit which writes data into the memory cell of the memory cell array and a replica write buffer circuit which is supplied with a read timing signal generated by use of the first replica bit line to drive the second replica bit line,
    wherein the second replica bit line has capacitance twice that of the bit line in the memory cell array and the replica write buffer circuit has current driving ability equal to that of the write buffer circuit.

2. The semiconductor device according to claim 1, further comprising:
    a sense amplifier which amplifies one of data read out from the memory cell in the memory cell array and data to be written into the memory cell,
    wherein the sense amplifier and write buffer circuit are activated by a read timing signal generated by use of the first replica bit line and the sense amplifier and write buffer circuit are deactivated by a write timing signal generated by use of the second replica bit line.

3. A semiconductor device comprising:
    a memory cell array having a plurality of memory cells arranged in an array form;
    a first replica bit line configured by wirings having substantially the same wiring width and wiring intervals as bit lines in the memory cell array and formed to generate a read timing signal;
    a second replica bit line configured by wirings having substantially the same wiring width and wiring intervals as the bit lines in the memory cell array and formed to generate a write timing signal; and
    a write buffer circuit which writes data into the memory cell in the memory cell array and a replica write buffer circuit which is supplied with a read timing signal generated by use of the first replica bit line to drive the second replica bit line,
    wherein the second replica bit line has capacitance equal to that of the bit line in the memory cell array and the replica write buffer circuit has current driving ability which is half that of the write buffer circuit.

4. The semiconductor device according to claim 3, further comprising a sense amplifier which amplifies one of data read out from the memory cell in the memory cell array and data to be written into the memory cell,
    wherein the sense amplifier and write buffer circuit are activated by a read timing signal generated by use of the first replica bit line and the sense amplifier and write buffer circuit are deactivated by a write timing signal generated by use of the second replica bit line.

5. The semiconductor device according to claim 1, further comprising an ECC circuit which corrects an error in data read out from the memory cell array.

6. A semiconductor device comprising:
    a memory cell array having a plurality of memory cells arranged in an array form;
    an ECC circuit which is configured to correct an error in data read out from the memory cell array;
    a first replica bit line configured by wirings having substantially the same wiring width and wiring intervals as bit lines in the memory cell array and formed to generate a first timing signal;
    a second replica bit line configured by wirings having substantially the same wiring width and wiring intervals as the bit lines in the memory cell array and formed to generate a second timing signal;

a replica write buffer circuit which is supplied with the first timing signal generated by use of the first replica bit line to drive the second replica bit line;

a write buffer circuit which is configured to be controlled according to the first and second timing signals to write data into the memory cell in the memory cell array; and a replica word line configured to be activated at the same time as a normal word line and cause delay time which is equal to word line delay time via a wiring having the same wiring length, wiring width and load capacitance as the normal word line.

7. The semiconductor device according to claim 6, further comprising a sense amplifier which is controlled according to the first and second timing signals to amplify one of data read out from the memory cell in the memory cell array and data to be written into the memory cell, wherein the sense amplifier and write buffer circuit are activated by the first timing signal generated by use of the first replica bit line and the sense amplifier and write buffer circuit are deactivated by the second timing signal generated by use of the second replica bit line.

8. The semiconductor device according to claim 6, wherein the second replica bit line has capacitance twice that of the bit line in the memory cell array and the replica write buffer circuit has current driving ability equal to that of the write buffer circuit.

9. The semiconductor device according to claim 6, wherein the second replica bit line has capacitance equal to that of the bit line in the memory cell array and the replica write buffer circuit has current driving ability which is half that of the write buffer circuit.

10. The semiconductor device according to claim 6, wherein the replica bit line is folded back at the center of the memory cell array and is supplied with a selection signal at one end thereof.

11. The semiconductor device according to claim 10, further comprising a replica cell which is connected to the other end of the replica word line and sets potential of the first replica bit line when the replica word line is activated.

12. The semiconductor device according to claim 6, further comprising:

a precharge circuit configured to precharge the first replica bit line according to the potential of the replica word line.

13. The semiconductor device according to claim 12, further comprising a logic circuit configured to generate the first timing signal according to a potential variation of the first replica bit line.

14. The semiconductor device according to claim 6, wherein the second replica bit line is arranged in an end portion of the memory cell array and folded back at the end portion of the memory cell array.

15. The semiconductor device according to claim 6, wherein the second replica bit line is arranged in an end portion of the memory cell array and folded back at a central portion of the memory cell array.

16. The semiconductor device according to claim 6, wherein the replica write buffer circuit includes a precharge circuit which is connected to both ends of the second replica bit line and configured to precharge the second replica bit line in response to the first timing signal and a discharge circuit which is connected to one end of the second replica bit line and configured to discharge the second replica bit line in response to the first timing signal.

17. The semiconductor device according to claim 16, further comprising a logic circuit which is connected to the other end of the second replica bit line and outputs the second timing signal.

18. A semiconductor device comprising:

a memory cell array having a plurality of memory cells arranged in an array form;

a first replica bit line configured by wirings having substantially the same wiring width and wiring intervals as bit lines in the memory cell array and formed to generate a read timing signal;

a second replica bit line configured by wirings having substantially the same wiring width and wiring intervals as the bit lines in the memory cell array and formed to generate a write timing signal;

a logic circuit which is supplied with a first timing signal and a second timing signal generated by the first and second replica bit lines;

a sense amplifier which is provided between a bit line pair and a data line pair, an operation of the sense amplifier being controlled by an output signal of the logic circuit; and a write buffer circuit which is provided between the bit line pair and the data line pair, an operation of the write buffer circuit being controlled by the output signal of the logic circuit, wherein the sense amplifier is activated to perform a read operation when the first timing signal generated by the first replica bit line is set to a level indicative of an active state, the write buffer circuit is operated to start a write operation simultaneously with the read operation, and when the second timing signal generated by the second replica bit line is set to the level indicative of an active state, the operation of the write buffer circuit is interrupted to terminate the write operation.

* * * * *